(12) United States Patent
Paul et al.

(10) Patent No.: US 10,354,694 B2
(45) Date of Patent: Jul. 16, 2019

(54) SYSTEMS AND METHODS FOR PROVIDING CONTENT ITEMS ASSOCIATED WITH OBJECTS

(71) Applicant: Facebook, Inc., Menlo Park, CA (US)

(72) Inventors: Debashish Paul, Sunnyvale, CA (US); Charles Matthew Sutton, San Francisco, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/395,836

(22) Filed: Dec. 30, 2016

(65) Prior Publication Data

US 2018/0190324 A1 Jul. 5, 2018

(51) Int. Cl.

| H04N 9/80 | (2006.01) |
|---|---|
| G11B 27/00 | (2006.01) |
| G11B 27/34 | (2006.01) |
| G06T 19/00 | (2011.01) |
| G11B 27/036 | (2006.01) |
| G11B 27/22 | (2006.01) |
| G06F 17/50 | (2006.01) |
| G06Q 30/02 | (2012.01) |
| H04N 5/93 | (2006.01) |
| H04N 13/00 | (2018.01) |

(52) U.S. Cl.
CPC .......... *G11B 27/34* (2013.01); *G06F 17/5009* (2013.01); *G06Q 30/0241* (2013.01); *G06T 19/006* (2013.01); *G11B 27/005* (2013.01); *G11B 27/036* (2013.01); *G11B 27/22* (2013.01)

(58) Field of Classification Search
CPC . H04N 9/80; H04N 5/93; H04N 13/00; G11B 27/00
USPC .......... 386/241, 239, 278, 280, 282; 348/42
See application file for complete search history.

(56) References Cited

U.S. PATENT DOCUMENTS

| 8,682,739 | B1 * | 3/2014 | Feinstein | G06Q 30/06 |
| | | | | 705/26.1 |
| 9,148,643 | B2 * | 9/2015 | Walker | H04N 21/00 |
| 2008/0295036 | A1 * | 11/2008 | Ikeda | G06T 11/206 |
| | | | | 715/848 |
| 2013/0076788 | A1 * | 3/2013 | Ben Zvi | G06T 19/006 |
| | | | | 345/633 |
| 2014/0143091 | A1 | 5/2014 | Malko | |
| 2014/0181678 | A1 | 6/2014 | Louchheim | |
| 2014/0359656 | A1 | 12/2014 | Banica | |
| 2016/0050465 | A1 | 2/2016 | Zaheer | |

OTHER PUBLICATIONS

International Application No. PCT/US2017/012066, International Search Report and Written Opinion dated Aug. 18, 2017.

* cited by examiner

*Primary Examiner* — Daquan Zhao
(74) *Attorney, Agent, or Firm* — Sheppard Mullin Richter & Hampton LLP

(57) ABSTRACT

Systems, methods, and non-transitory computer readable media can identify an object included in a video content item. A content item associated with the object can be determined during playback of the video content item, wherein the content item is one or more of: a two-dimensional content item or a three-dimensional content item. An indicator associated with the content item can be provided in the video content item. The content item can be provided in response to a selection of the indicator.

20 Claims, 9 Drawing Sheets

400

Identify an object included in a video content item
402

Determine a content item associated with the object during playback of the video content item, wherein the content item is one or more of: a two-dimensional content item or a three-dimensional content item
404

Provide an indicator associated with the content item in the video content item
406

Provide the content item in response to a selection of the indicator
408

FIGURE 4

SYSTEMS AND METHODS FOR PROVIDING CONTENT ITEMS ASSOCIATED WITH OBJECTS

FIELD OF THE INVENTION

The present technology relates to content presentation. More particularly, the present technology relates to techniques for providing content items in connection with objects within content items.

BACKGROUND

Today, people often utilize computing devices (or systems) for a wide variety of purposes. Users can operate their computing devices to, for example, interact with one another, create content, share content, and access information. Under conventional approaches, content items (e.g., images, videos, audio files, etc.) can be made available through a content sharing platform. Users can operate their computing devices to access the content items through the platform. Typically, the content items can be provided, or uploaded, by various entities including, for example, content publishers and also users of the content sharing platform. In some instances, the content items can be categorized and/or curated.

SUMMARY

Various embodiments of the present disclosure can include systems, methods, and non-transitory computer readable media configured to identify an object included in a video content item. A content item associated with the object can be determined during playback of the video content item, wherein the content item is one or more of: a two-dimensional content item or a three-dimensional content item. An indicator associated with the content item can be provided in the video content item. The content item can be provided in response to a selection of the indicator.

In some embodiments, the selection of the indicator associated with the content item creates a layer for presenting three-dimensional content, and wherein the content item is provided in the layer.

In certain embodiment, the layer is an augmented reality (AR) layer.

In an embodiment, the content item is a three-dimensional model of an object.

In some embodiments, the layer is presented on top of the video content item.

In certain embodiments, the layer is removed in response to one or more of: completion of playback of the content item or a selection by a user.

In an embodiment, the object includes one or more of: a logo or a brand.

In some embodiments, the identified object is detected based on one or more of: object detection or object tracking.

In certain embodiments, the identified object is defined in the video content item based on user input.

In an embodiment, the content item includes one or more of: an advertisement or a menu for purchasing an item associated with the object.

It should be appreciated that many other features, applications, embodiments, and/or variations of the disclosed technology will be apparent from the accompanying drawings and from the following detailed description. Additional and/or alternative implementations of the structures, systems, non-transitory computer readable media, and methods described herein can be employed without departing from the principles of the disclosed technology.

BRIEF DESCRIPTION OF THE DRAWINGS

FIG. 4 illustrates an example first method for providing related content items associated with objects included in content items, according to an embodiment of the present disclosure.

Figure 1:
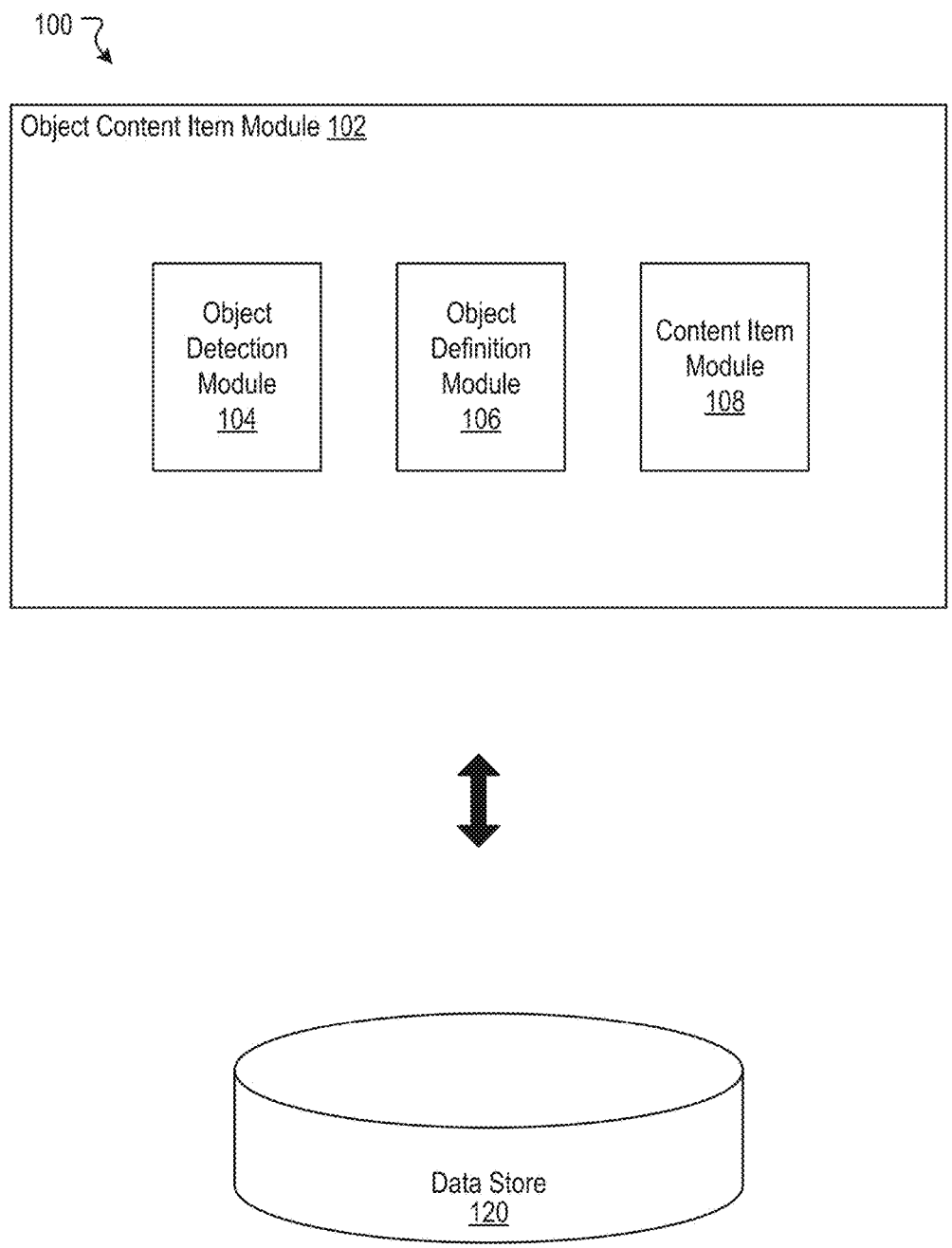
FIG. 1 illustrates an example system including an example object content item module configured to provide related content items associated with objects included in content items, according to an embodiment of the present disclosure.

The figures depict various embodiments of the disclosed technology for purposes of illustration only, wherein the figures use like reference numerals to identify like elements. One skilled in the art will readily recognize from the following discussion that alternative embodiments of the structures and methods illustrated in the figures can be employed without departing from the principles of the disclosed technology described herein.

DETAILED DESCRIPTION

Providing Content Items Associated with Objects

People use computing devices (or systems) for a wide variety of purposes. As mentioned, under conventional approaches, a user can utilize a computing device to share content items (e.g., documents, images, videos, audio, etc.) with other users. Under conventional approaches, content items (e.g., images, videos, audio files, etc.) can be made available through a content sharing platform. Users can operate their computing devices to access the content items through the platform. Typically, the content items can be provided, or uploaded, by various entities including, for example, content publishers and also users of the content sharing platform. An example of the content sharing platform can include a social networking system.

Content items, such as videos, can include or depict one or more objects in a scene. For example, a user can capture a scene with a camera and create a video, and there can be one or more objects in the scene, for example, in the foreground or the background. Conventional approaches specifically arising in the realm of computer technology may provide content items without further processing with respect to objects included within content items. Accordingly, conventional approaches may not provide additional content items relating to objects included within content items.

An improved approach rooted in computer technology can overcome the foregoing and other disadvantages associated with conventional approaches specifically arising in the realm of computer technology. Based on computer technology, the disclosed technology can identify one or more objects included within content items and provide additional content items in connection with the one or more identified objects. An additional content item relating to an identified object can be referred to as a "related content item." For example, identification of objects included within a content item and provision of related content items can occur during playback of the content item. In some embodiments, identification of objects included within a content item and provision of related content items can occur as the content item is being recorded. Examples of content items can include videos, images, etc. Objects can include any recognizable objects that are captured from the real world. In some embodiments, objects can include logos and/or brands. Objects within content items can be detected based on object recognition or detection. In certain embodiments, detecting objects within content items can be based on machine learning techniques. In content items like videos, objects may move from one frame to another, and objects can be tracked between frames in order to detect objects. Examples of related content items relating to identified objects can include information, advertisements, menus or links for purchase (e.g., products, services, etc.), etc. Related content items can be provided in various ways. For instance, an indicator can be provided within a content item in order to signal that a related content item is available for access. As an example, a bar or a box can be displayed within a content item, and the bar or the box can provide access to a related content item. As another example, a shape (e.g., circle, square, etc.) can be displayed near an identified object within a content item, and the shape can provide access to a related content item. In some embodiments, related content items can be provided in a virtual three-dimensional space, such as an augmented reality (AR) space. In this way, the disclosed technology can identify objects included within content items and provide related content items in connection with at least some identified objects. Details relating to the disclosed technology are explained below.

FIG. 1 illustrates an example system 100 including an example object content item module 102 configured to provide related content items associated with objects included in content items, according to an embodiment of the present disclosure. The object content item module 102 can include an object detection module 104, an object definition module 106, and a content item module 108. In some instances, the example system 100 can include at least one data store 120. The components (e.g., modules, elements, steps, blocks, etc.) shown in this figure and all figures herein are exemplary only, and other implementations may include additional, fewer, integrated, or different components. Some components may not be shown so as not to obscure relevant details. In various embodiments, one or more of the functionalities described in connection with the object content item module 102 can be implemented in any suitable combinations. The disclosed technology can apply to any type of content. For example, content items in which objects are identified can include any type of content. Similarly, related content items that are provided in connection with objects included in content items can include any type of content. The disclosed technology can apply to any type of system, including a social networking system.

Content items can include any type of content that can include or depict objects, such as videos, images, etc. For example, a video content item can include a captured scene in the real world, which can include one or more objects. Videos and images are some examples of two-dimensional (2D) content. In some embodiments, content items can include three-dimensional (3D) content. For example, content items can include spherical videos (or 360 videos), augmented reality content items, virtual reality (VR) content items, etc. Objects within a content item can be identified based on object detection, object definition, or both. For example, objects within content items can be detected based on machine learning techniques. As another example, objects within content items can be defined, based on user input. In certain embodiments, objects can be created and added to content items. In some embodiments, objects can include logos and/or brands.

The object detection module 104 can detect objects within content items. The object detection module 104 can detect objects within a content item based on object recognition or detection. The object detection module 104 can detect objects within a content item based on a machine learning model. In some embodiments, the machine learning model can be a classifier. The machine learning model can be trained based on training data that includes objects and associated images. The trained machine learning model can be applied to images or video of objects from content items in order to determine objects included within content items. In some embodiments, objects can be detected at a time a content item is created. For example, a recorded video can be uploaded to a server, or a live video can be uploaded to a server as it is being recorded. The object detection module 104 can perform object detection on available data for a content item. For example, the object detection module 104 can perform object detection on frames of a live video obtained up to that point. In other embodiments, objects can be detected at a time a content item is played back. For example, the object detection module 104 can perform object detection during an initial playback of the content item and store information relating to detected objects. As another example, the object detection module can 104 perform object detection for each playback of the content item. For some content items, such as videos, objects may move from one frame to another, and objects can be tracked between frames in order to detect objects. In some embodiments, the object detection module 104 can detect objects within content items in or near real time. All examples herein are provided for illustrative purposes, and there can be many variations and other possibilities.

The object definition module 106 can define objects within content items. In some cases, a user may want to designate certain objects within content items for which to provide related content items. The object definition module 106 can allow users or administrators of a system, such as a social networking system, to define objects within content items. For example, if a video content item depicts a logo, a user can designate the logo as an object for which a related content item can be provided. As explained above, defining objects based on user input can be used alone or in combination with object detection as explained above. All examples herein are provided for illustrative purposes, and there can be many variations and other possibilities.

The content item module 108 can provide related content items associated with objects identified within content items. For example, the content item module 108 can determine one or more related content items for an identified object. In some embodiments, the content item module 108 can determine whether to provide related content items for an identified object. For example, the content item module 108 can determine whether to provide a related content item for an identified object based on various criteria. In some embodiments, the content item module 108 can provide related content items in or near real time. For instance, related content items associated with objects identified within a content item can be provided as the content item is being recorded, for example, on a device recording the content item. Functionality of the content item module 108 is described in more detail herein.

In some embodiments, the object content item module 102 can be implemented, in part or in whole, as software, hardware, or any combination thereof. In general, a module as discussed herein can be associated with software, hardware, or any combination thereof. In some implementations, one or more functions, tasks, and/or operations of modules can be carried out or performed by software routines, software processes, hardware, and/or any combination thereof. In some cases, the object content item module 102 can be, in part or in whole, implemented as software running on one or more computing devices or systems, such as on a server system or a client computing device. In some instances, the object content item module 102 can be, in part or in whole, implemented within or configured to operate in conjunction or be integrated with a social networking system (or service), such as a social networking system 630 of FIG. 6. Likewise, in some instances, the object content item module 102 can be, in part or in whole, implemented within or configured to operate in conjunction or be integrated with a client computing device, such as the user device 610 of FIG. 6. For example, the object content item module 102 can be implemented as or within a dedicated application (e.g., app), a program, or an applet running on a user computing device or client computing system. It should be understood that many variations are possible.

The data store 120 can be configured to store and maintain various types of data, such as the data relating to support of and operation of the object content item module 102. The data maintained by the data store 120 can include, for example, information relating to content items, objects included in content items (e.g., detected objects, defined objects, etc.), object detection, object definition, related content items (e.g., advertisements, shopping menus or links, augmented reality content items, etc.), etc. The data store 120 also can maintain other information associated with a social networking system. The information associated with the social networking system can include data about users, social connections, social interactions, locations, geofenced areas, maps, places, events, groups, posts, communications, content, account settings, privacy settings, and a social graph. The social graph can reflect all entities of the social networking system and their interactions. As shown in the example system 100, the object content item module 102 can be configured to communicate and/or operate with the data store 120. In some embodiments, the data store 120 can be a data store within a client computing device. In some embodiments, the data store 120 can be a data store of a server system in communication with the client computing device.

Figure 2:
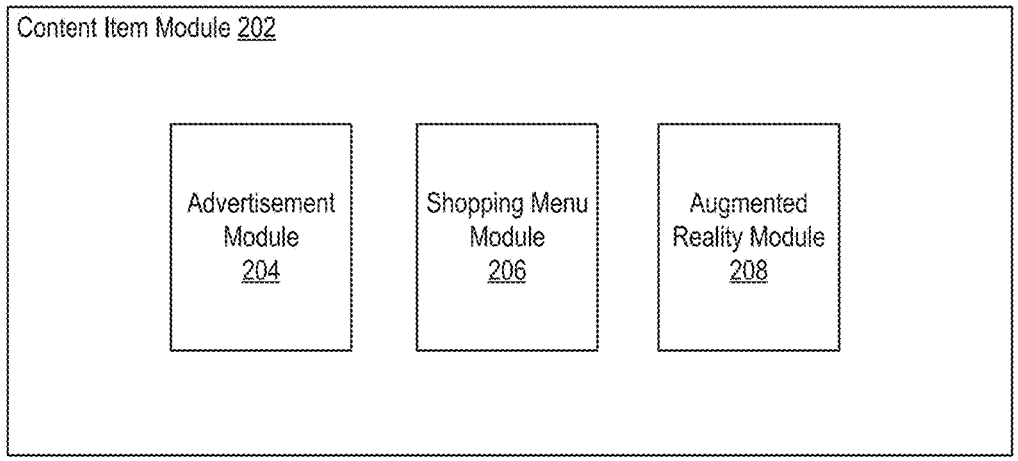
FIG. 2 illustrates an example content item module configured to provide related content items associated with objects identified within content items, according to an embodiment of the present disclosure.

FIG. 2 illustrates an example content item module 202 configured to provide related content items associated with objects identified within content items, according to an embodiment of the present disclosure. In some embodiments, the content item module 108 of FIG. 1 can be implemented with the example content item module 202. As shown in the example of FIG. 2, the example content item module 202 can include an advertisement module 204, a shopping menu module 206, and an augmented reality module 208.

The content item module 202 can determine one or more related content items to provide in connection with an object identified within a content item. Objects identified within a content item can have time information associated with them. For example, in a video content item, frames in the video can have timestamps associated with them. Accordingly, an object identified from a frame in the video can have a timestamp associated with it, which corresponds to the timestamp of the frame. An object may appear across multiple frames in the video. In some embodiments, the object can be associated with a timestamp of a frame in which it is first identified. In other embodiments, the object can be associated with timestamps of all frames in which it appears. Related content items can be provided based on time information associated with identified objects. Related content items can include any type of content. Related content items can provide any type of information relating to identified objects. Some examples of related content items can include advertisements, shopping menu or links, etc. In some embodiments, related content items can include three-dimensional content. For example, related content items can include spherical videos, 360 photos, augmented reality content items, virtual reality content items, etc. Related content items can be determined based on various criteria. In some embodiments, a total number of related content items provided for a content item can be determined based on a length of the content item.

The advertisement module 204 can provide an advertisement content item as a related content item associated with an object. If an object is identified in, for example, a video content item, an advertisement to be displayed in connection with the object can be selected based on the identified object. In some embodiments, the advertisement can also be a video content item. The advertisement can be selected based on a type of the identified object, an entity associated with the identified object, etc. As an example, if the identified object is a logo of a company, the advertisement can be an advertisement for the company or a product of the company. The advertisement to be provided can be determined dynamically during playback of the content item. There can be one or more candidate advertisements that can be provided with the identified object. The advertisement can be selected from the candidate advertisements based on various criteria. For example, an advertisement can have targeting criteria associated with it, and an advertisement can be selected for a user if the user satisfies the targeting criteria. Targeting criteria can include demographic characteristics associated with users. Examples of targeting criteria can include an age, an age range, a gender, a geographical region (e.g., country, state, city, etc.), an interest, etc.

The advertisement module 204 can provide a selected advertisement in connection with the identified object. An indicator that the advertisement is available for access can be provided within the content item. As an example, the indicator can be a bar or a box that is displayed in a frame of the video content item (e.g., top, bottom, left, right, etc.). If a user selects or interacts with the indicator, the advertisement can be provided to the user. In some cases, the playback of the content item can pause while the user is viewing the advertisement. The advertisement can be provided on top of or over the content item and presented as an overlay. For example, the advertisement can appear on top of the content item such that content item is not visible to a user while the advertisement is playing. The playback of the content item can resume when the user indicates the user is done viewing the advertisement. For example, the user can stop or finish watching the advertisement. The indicator can be provided for a predetermined time period from a timestamp associated with the identified object. For example, the timestamp associated with the identified object can be a timestamp of a frame in which the identified object is first identified. The predetermined time period can be defined as appropriate, for example, as a setting or a variable. For example, the indicator can be provided for 5 seconds from the timestamp associated with the identified object. If another object is identified while the indicator for a previously identified object is being provided for the predetermined time period, related content items for the other object may not be provided or may be provided with a delay. For example, an indicator associated with the other object may not be provided. As another example, an indicator associated with the other object may be provided after a delay, for example, after the predetermined time period passes for the indicator for the previously identified object. In some embodiments, one or more advertisements provided during the playback of the content item can be accessible after the playback of the content item completes. For example, links to the one or more advertisements can be displayed.

A content item, such as a video content item, can include objects associated with a common timestamp or different timestamps. For example, as described above, frames of a video content item can be associated with respective timestamps. One or more frames of the video can include objects. Accordingly, there can be identified objects associated with different timestamps. An advertisement can be provided for each timestamp associated with an identified object. For example, advertisements for different timestamps can be provided consecutively. A frame of the video can include one or more objects. Accordingly, there can be multiple objects associated with the same timestamp. In some embodiments, the advertisement module 204 can select one of the multiple objects for which to provide an advertisement. In other embodiments, the advertisement module 204 can provide advertisements for the multiple objects in sequence or in parallel. For example, indicators for the advertisements can be displayed in sequence or in parallel. All examples herein are provided for illustrative purposes, and there can be many variations and other possibilities.

The shopping menu module 206 can provide a shopping menu or link as a related content item associated with an object. If an object is identified in a content item, such as a video content item, a shopping menu to be displayed in connection with the object can be generated based on the identified object. The shopping menu to be provided can be generated dynamically during playback of the content item. The shopping menu can be generated based on a type of the identified object, a brand associated with the identified object, an entity associated with the identified object, etc. For example, the identified object can be a logo of a brand, and the shopping menu can be a shopping menu for products from the brand. In some embodiments, the shopping menu can provide a link to a page for the brand, such as a website. The user can access the shopping menu and browse products from the brand. In other embodiments, the shopping menu can provide a link to a particular product from the brand. The user can access the shopping menu and directly view a page for the particular product. The shopping menu can include one or more menu items. For example, a link to the page for the brand or a link to a page for a product of the brand can be a menu item. In some embodiments, the identified object can be a product, and the shopping menu can be a shopping menu to purchase the product.

The shopping menu module 206 can determine objects, such as brands and/or products of brands, for which to provide shopping menus based on various criteria. For example, the shopping menu module 206 can determine whether to provide shopping menus for certain objects to certain users based on various criteria. Criteria for providing shopping menus can include demographic characteristics associated with users. Examples of criteria can include an age, an age range, a gender, a geographical region (e.g., country, state, city, etc.), an interest, etc. A shopping menu can be provided to a user if the user satisfies the criteria. The shopping menu can be displayed in connection with the content item. As an example, the shopping menu can be displayed below the content item within a user interface. In certain embodiments, the shopping menu can be displayed with accompanying effects. As an example, when a brand in the content item is identified and a shopping menu is created, the shopping menu can be displayed with a flying out effect from the brand in the content item. The shopping menu can act as its own indicator. However, in some embodiments, a separate indicator can be provided for the shopping menu, and the shopping menu can be provided in response to user selection of or user interaction with the indicator. The shopping menu can be provided for a predetermined time period from a timestamp associated with the identified object. The predetermined time period can be defined as appropriate, for example, as a setting or a variable. For example, the shopping menu can be provided for 5 seconds from the timestamp associated with the identified object. In some embodiments, one or more shopping menus and/or menu items provided during the playback of the content item can be accessible after the playback of the content item completes.

As explained above, a content item, such as a video content item, can include more than one object associated with a particular timestamp and/or include objects that are associated with different timestamps. If more than one object is associated with a particular timestamp, a shopping menu can include menu items for multiple objects. If objects are associated with different timestamps, a shopping menu can be provided for each timestamp for which an object is identified. For example, a separate shopping menu can be created for each timestamp and provided in sequence. In some cases, menu items for different timestamps can be added to an existing shopping menu. All examples herein are provided for illustrative purposes, and there can be many variations and other possibilities.

The augmented reality module 208 can provide an AR content item as a related content item associated with an object. In some embodiments, an AR content item can provide an experience that is similar to AR in connection with a two-dimensional (2D) content item like a video. For example, an AR content item can provide an interactive 3D model associated with an object. In certain embodiments, the augmented reality module 208 can provide other types of 3D content, such as spherical videos, 360 photos, or VR content items. The AR content item can be selected based on a type of the identified object, an entity associated with the identified object, etc. As an example, if the identified object is a logo of a company, the AR content item can be an AR content item for a product of the company. The AR content item to be provided can be determined dynamically during playback of the content item. There can be one or more candidate AR content items that can be provided with the identified object. The AR content item can be selected from the candidate AR content items based on various criteria. Criteria for providing an AR content item can include demographic characteristics associated with users. Examples of criteria can include an age, an age range, a gender, a geographical region (e.g., country, state, city, etc.), an interest, etc. An AR content item can be provided to a user if the user satisfies the criteria.

The augmented reality module 208 can provide a selected AR content item in connection with the identified object. An indicator that the AR content item is available for access can be provided within the content item. As an example, the indicator can be a shape (e.g., a circle, a square, etc.) or a marker that is displayed in a frame of the content item near or on the identified object. The indicator can be provided for a predetermined time period from a timestamp associated with the identified object. The predetermined time period can be defined as appropriate, for example, as a setting or a variable. For example, the indicator can be provided for 5 seconds from the timestamp associated with the identified object. If a user selects or interacts with the indicator, the AR content item can be provided to the user. The augmented reality module 208 can create a surface or layer for presenting the AR content item. A surface or layer for presenting an AR content item can be referred to as an "AR surface." The AR surface can be created on top of or over the content item. For example, the AR surface can appear as an overlay on top of the content item. In some embodiments, the content item can be visible under the AR surface. In other embodiments, the content item may not be visible under the AR surface. The playback of the content item can pause while the user is interacting with the AR content item. The playback of the content item can resume when the user indicates the user is done viewing the AR content item. For example, the user can close or exit the AR surface. In some embodiments, one or more AR content items provided during the playback of the content item can be accessible after the playback of the content item completes. For example, links to the one or more AR content items can be displayed.

As described above, a content item, such as a video content item, can include more than one object associated with a particular timestamp and/or include objects that are associated with different timestamps. If more than one object is associated with a particular timestamp, indicators for multiple objects can be provided for the particular timestamp. If objects are associated with different timestamps, an AR content item can be provided for each timestamp for which an object is identified. For example, AR content items for different timestamps can be provided consecutively. All examples herein are provided for illustrative purposes, and there can be many variations and other possibilities.

Figure 3A:
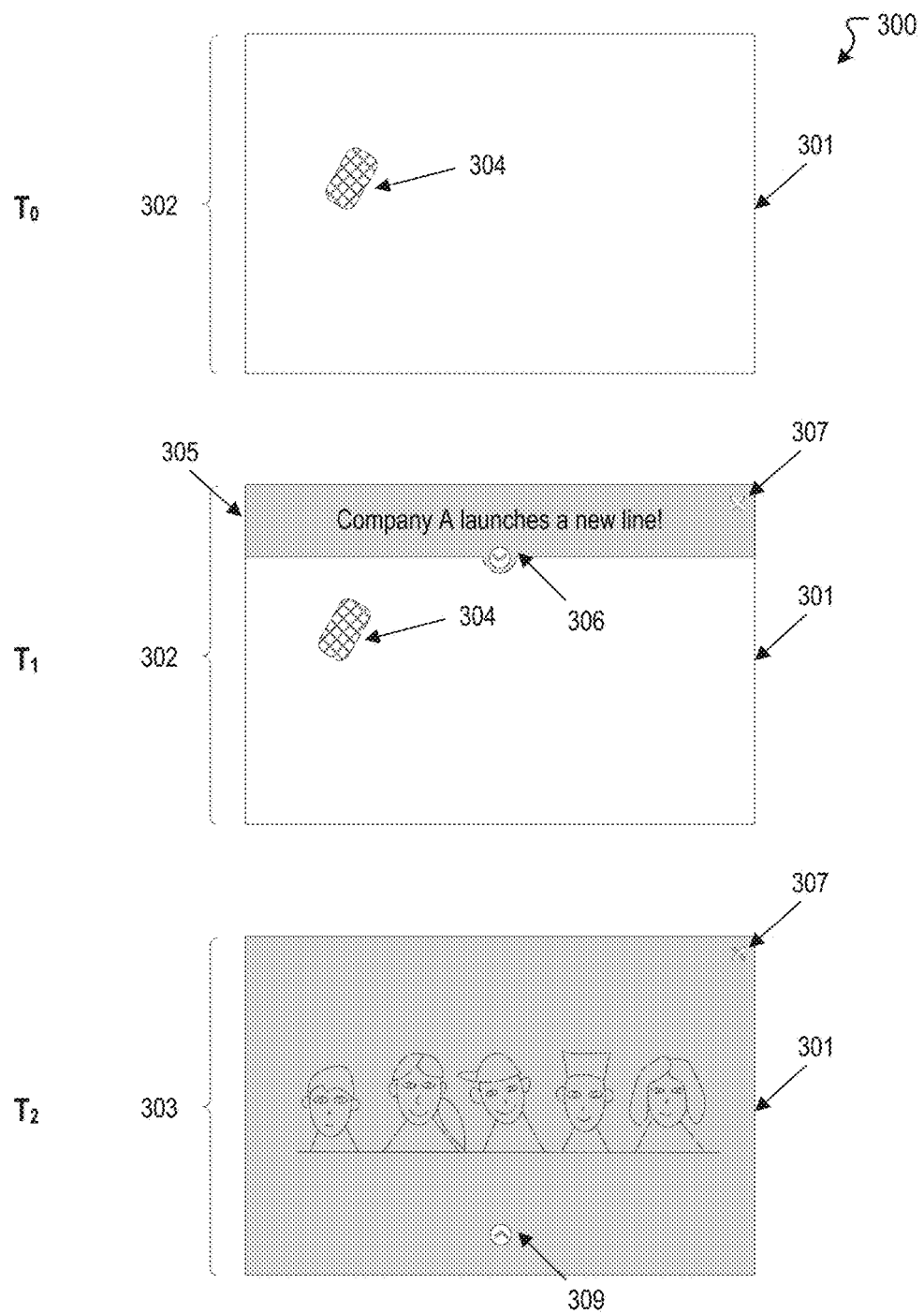
FIG. 3A illustrates an example scenario for providing advertisement content items relating to objects included in content items, according to an embodiment of the present disclosure.

FIG. 3A illustrates an example scenario 300 for providing advertisement content items relating to objects included in content items, according to an embodiment of the present disclosure. In the example scenario 300, an advertisement is provided for an identified object included in a content item. The example scenario 300 shows a user interface 301 at three different points in time $T_0$, $T_1$, $T_2$. At $T_0$, the user interface 301 is playing back a content item 302. The content item 302 includes an object 304 at $T_0$. The object 304 can be identified based on various techniques as described above. An advertisement can be selected for the object 304. At $T_1$, the user interface 301 is still playing back the content item 302. An indicator 305 is provided through the user interface 301 as an overlay on the content item 302 to indicate that an advertisement is available in connection with the object 304. In the example scenario 300, the indicator 305 is provided as a bar at the top of the content item 302. A user can select an icon 306 (e.g., a chevron) in the indicator 305 to access the advertisement. Or the user can select an icon 307 (e.g., a close icon) in the indicator 305 to dismiss the indicator 305. At $T_2$, the user interface 301 provides the advertisement 303 in response to the user selecting the icon 306 at $T_1$. The playback of the content item 302 can pause while the advertisement 303 is played back. The user can stop playing the advertisement 303 by selecting the icon 307 or an icon 309 (e.g., a chevron).

Figure 3B:
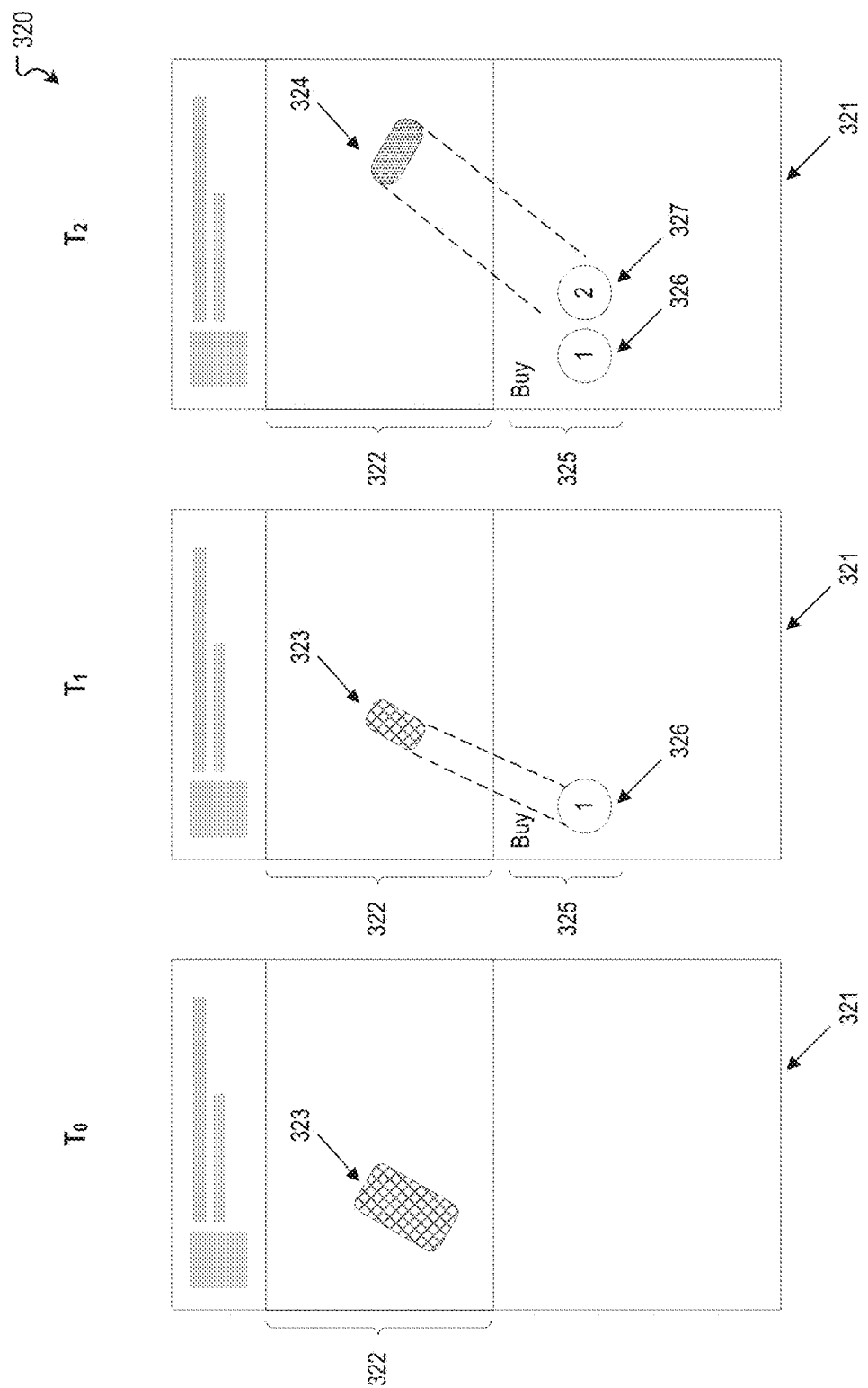
FIG. 3B illustrates an example scenario for providing shopping menu content items relating to objects included in content items, according to an embodiment of the present disclosure.

FIG. 3B illustrates an example scenario 320 for providing shopping menu content items relating to objects included in content items, according to an embodiment of the present disclosure. In the example scenario 320, a shopping menu is provided for an identified object included in a content item. The example scenario 320 shows a user interface 321 at three different points in time $T_0$, $T_1$, $T_2$. At $T_0$, the user interface 321 is playing back a content item 322. The content item 322 includes an object 323 at $T_0$. The object 323 can be identified based on various techniques as described above. At $T_1$, a shopping menu 325 can be created for the object 323. The shopping menu 325 can include a menu item 326 for the object 323. The shopping menu 325 and/or the menu item 326 can be displayed with an accompanying effect. For example, the menu item 326 can displayed with a flying out effect from the object 323. At $T_2$, the user interface 321 is still playing back the content item 322. The content item 322 includes an object 324 at $T_2$. A menu item 327 can be created for the object 324. The menu item 327 can also be displayed with an accompanying effect, such as a flying out effect. In some embodiments, the objects 323, 324 can be different logos or brands, and the menu items 326, 327 can be links to respective pages of the logos or brands. In certain embodiments, the objects 323, 324 can be different products associated with the same logo or brand, and the menu items 326, 327 can be links to respective products. Many variations are possible.

Figure 3C:
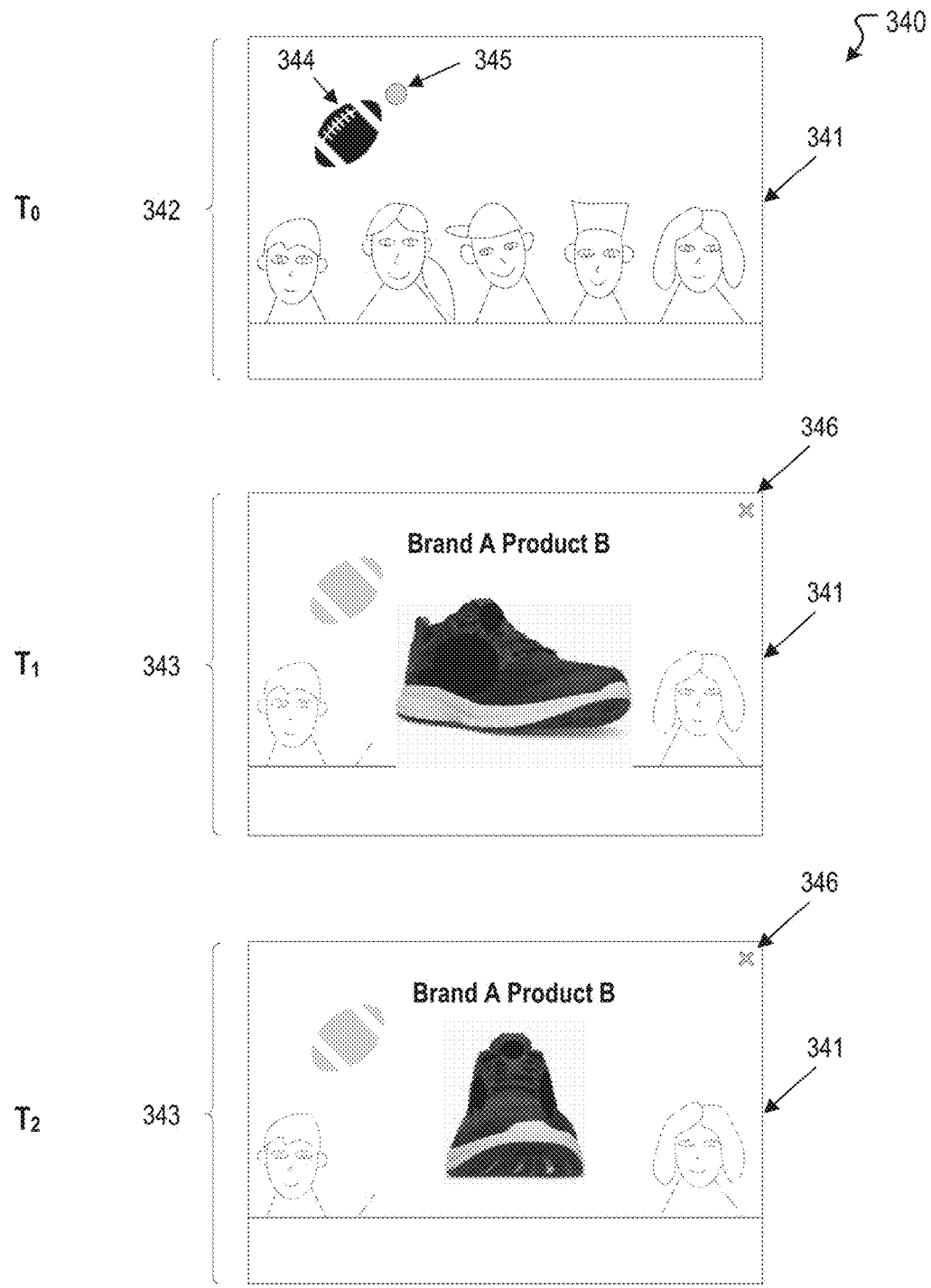
FIG. 3C illustrates an example scenario for providing augmented reality content items relating to objects included in content items, according to an embodiment of the present disclosure.

FIG. 3C illustrates an example scenario 340 for providing augmented reality content items relating to objects included in content items, according to an embodiment of the present disclosure. In the example scenario 340, an AR content item is provided for an identified object included in a content item. The example scenario 340 shows a user interface 341 at three different points in time $T_0$, $T_1$, $T_2$. At $T_0$, the user interface 341 is playing back a content item 342. The content item 342 includes an object 344 at $T_0$. The object 344 can be identified based on various techniques as described above. An AR content item can be selected for the object 344. An indicator 345 is provided within the content item 342 to indicate that an AR content item is available in connection with the object 344. A user can select the indicator 345 to access the advertisement. In response to user selection of the indicator 345, the user interface 341 creates an AR surface in order to provide the AR content item. At $T_1$, the user interface 341 plays back the AR content item 343. In some embodiments, an AR content item can provide an experience that is similar to AR in connection with a two-dimensional (2D) content item like a video. In the example scenario 340, the AR content item can provide a 3D model of a product of a brand. The 3D model can be interactive. For example, the user can interact with the 3D model using a gesture, a selection, etc. The example scenario 340 shows a 3D model of a shoe, which can be rotated. At $T_2$, the user interface 341 is still playing back the AR content item 343. The playback of the content item 342 can pause while the AR content item 343 is played back. The content item 342 can be partially visible under the AR surface. The user can stop playing the AR content item 343 by selecting an icon 346 and closing the AR surface.

FIG. 4 illustrates an example first method 400 for providing related content items associated with objects included in content items, according to an embodiment of the present disclosure. It should be understood that there can be additional, fewer, or alternative steps performed in similar or alternative orders, or in parallel, based on the various features and embodiments discussed herein unless otherwise stated.

At block 402, the example method 400 can identify an object included in a video content item. At block 404, the example method 400 can determine a content item associated with the object during playback of the video content item, wherein the content item is one or more of: a two-dimensional content item or a three-dimensional content item. At block 406, the example method 400 can provide an indicator associated with the content item in the video content item. At block 408, the example method 400 can provide the content item in response to a selection of the indicator. Other suitable techniques that incorporate various features and embodiments of the present disclosure are possible.

Figure 5:
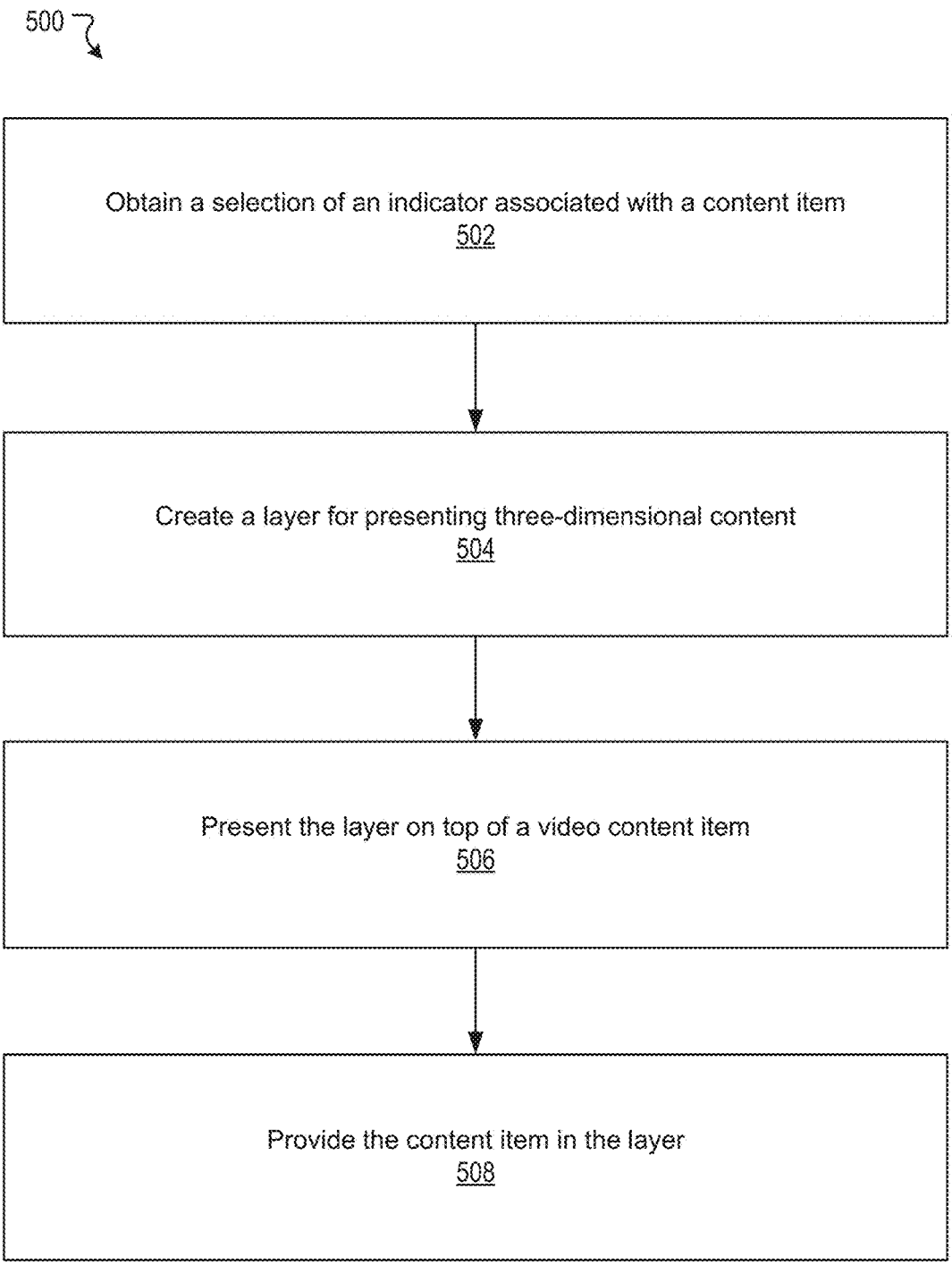
FIG. 5 illustrates an example second method for providing related content items associated with objects included in content items, according to an embodiment of the present disclosure.

FIG. 5 illustrates an example second method 500 for providing related content items associated with objects included in content items, according to an embodiment of the present disclosure. It should be understood that there can be additional, fewer, or alternative steps performed in similar or alternative orders, or in parallel, based on the various features and embodiments discussed herein unless otherwise stated. Certain steps of the method 500 may be performed in combination with the example method 400 explained above.

At block 502, the example method 500 can obtain a selection of an indicator associated with a content item. The indicator can be similar to the indicator explained in connection with FIG. 4. The content item can be similar to the content item explained in connection with FIG. 4. At block 504, the example method 500 can create a layer for presenting three-dimensional content. At block 506, the example method 500 can present the layer on top of a video content item. The video content item can be similar to the video content item explained in connection with FIG. 4. At block 508, the example method 500 can provide the content item in the layer. Other suitable techniques that incorporate various features and embodiments of the present disclosure are possible.

It is contemplated that there can be many other uses, applications, features, possibilities, and/or variations associated with various embodiments of the present disclosure. For example, users can, in some cases, choose whether or not to opt-in to utilize the disclosed technology. The disclosed technology can, for instance, also ensure that various privacy settings, preferences, and configurations are maintained and can prevent private information from being divulged. In another example, various embodiments of the present disclosure can learn, improve, and/or be refined over time.

Social Networking System—Example Implementation

Figure 6:
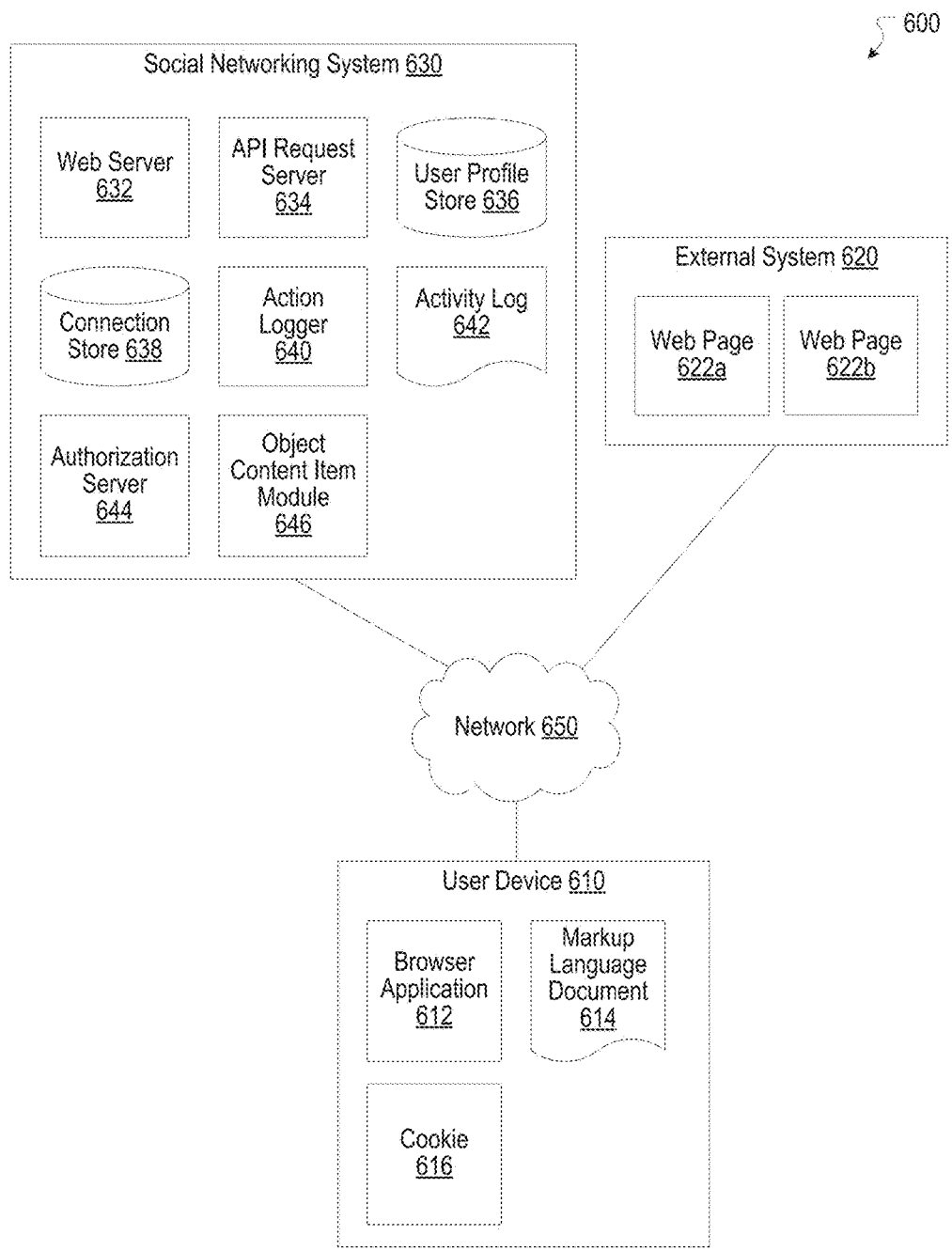
FIG. 6 illustrates a network diagram of an example system that can be utilized in various scenarios, according to an embodiment of the present disclosure.

FIG. 6 illustrates a network diagram of an example system 600 that can be utilized in various scenarios, in accordance with an embodiment of the present disclosure. The system 600 includes one or more user devices 610, one or more external systems 620, a social networking system (or service) 630, and a network 650. In an embodiment, the social networking service, provider, and/or system discussed in connection with the embodiments described above may be implemented as the social networking system 630. For purposes of illustration, the embodiment of the system 600, shown by FIG. 6, includes a single external system 620 and a single user device 610. However, in other embodiments, the system 600 may include more user devices 610 and/or more external systems 620. In certain embodiments, the social networking system 630 is operated by a social network provider, whereas the external systems 620 are separate from the social networking system 630 in that they may be operated by different entities. In various embodiments, however, the social networking system 630 and the external systems 620 operate in conjunction to provide social networking services to users (or members) of the social networking system 630. In this sense, the social networking system 630 provides a platform or backbone, which other systems, such as external systems 620, may use to provide social networking services and functionalities to users across the Internet.

The user device 610 comprises one or more computing devices that can receive input from a user and transmit and receive data via the network 650. In one embodiment, the user device 610 is a conventional computer system executing, for example, a Microsoft Windows compatible operating system (OS), Apple OS X, and/or a Linux distribution. In another embodiment, the user device 610 can be a device having computer functionality, such as a smart-phone, a tablet, a personal digital assistant (PDA), a mobile telephone, etc. The user device 610 is configured to communicate via the network 650. The user device 610 can execute an application, for example, a browser application that allows a user of the user device 610 to interact with the social networking system 630. In another embodiment, the user device 610 interacts with the social networking system 630 through an application programming interface (API) provided by the native operating system of the user device 610, such as iOS and ANDROID. The user device 610 is configured to communicate with the external system 620 and the social networking system 630 via the network 650, which may comprise any combination of local area and/or wide area networks, using wired and/or wireless communication systems.

In one embodiment, the network 650 uses standard communications technologies and protocols. Thus, the network 650 can include links using technologies such as Ethernet, 802.11, worldwide interoperability for microwave access (WiMAX), 3G, 4G, CDMA, GSM, LTE, digital subscriber line (DSL), etc. Similarly, the networking protocols used on the network 650 can include multiprotocol label switching (MPLS), transmission control protocol/Internet protocol (TCP/IP), User Datagram Protocol (UDP), hypertext transport protocol (HTTP), simple mail transfer protocol (SMTP), file transfer protocol (FTP), and the like. The data exchanged over the network 650 can be represented using technologies and/or formats including hypertext markup language (HTML) and extensible markup language (XML). In addition, all or some links can be encrypted using conventional encryption technologies such as secure sockets layer (SSL), transport layer security (TLS), and Internet Protocol security (IPsec).

In one embodiment, the user device 610 may display content from the external system 620 and/or from the social networking system 630 by processing a markup language document 614 received from the external system 620 and from the social networking system 630 using a browser application 612. The markup language document 614 identifies content and one or more instructions describing formatting or presentation of the content. By executing the instructions included in the markup language document 614, the browser application 612 displays the identified content using the format or presentation described by the markup language document 614. For example, the markup language document 614 includes instructions for generating and displaying a web page having multiple frames that include text and/or image data retrieved from the external system 620 and the social networking system 630. In various embodiments, the markup language document 614 comprises a data file including extensible markup language (XML) data, extensible hypertext markup language (XHTML) data, or other markup language data. Additionally, the markup language document 614 may include JavaScript Object Notation (JSON) data, JSON with padding (JSONP), and JavaScript data to facilitate data-interchange between the external system 620 and the user device 610. The browser application 612 on the user device 610 may use a JavaScript compiler to decode the markup language document 614.

The markup language document 614 may also include, or link to, applications or application frameworks such as FLASH™ or Unity™ applications, the SilverLight™ application framework, etc.

In one embodiment, the user device 610 also includes one or more cookies 616 including data indicating whether a user of the user device 610 is logged into the social networking system 630, which may enable modification of the data communicated from the social networking system 630 to the user device 610.

The external system 620 includes one or more web servers that include one or more web pages 622a, 622b, which are communicated to the user device 610 using the network 650. The external system 620 is separate from the social networking system 630. For example, the external system 620 is associated with a first domain, while the social networking system 630 is associated with a separate social networking domain. Web pages 622a, 622b, included in the external system 620, comprise markup language documents 614 identifying content and including instructions specifying formatting or presentation of the identified content.

The social networking system 630 includes one or more computing devices for a social network, including a plurality of users, and providing users of the social network with the ability to communicate and interact with other users of the social network. In some instances, the social network can be represented by a graph, i.e., a data structure including edges and nodes. Other data structures can also be used to represent the social network, including but not limited to databases, objects, classes, meta elements, files, or any other data structure. The social networking system 630 may be administered, managed, or controlled by an operator. The operator of the social networking system 630 may be a human being, an automated application, or a series of applications for managing content, regulating policies, and collecting usage metrics within the social networking system 630. Any type of operator may be used.

Users may join the social networking system 630 and then add connections to any number of other users of the social networking system 630 to whom they desire to be connected. As used herein, the term "friend" refers to any other user of the social networking system 630 to whom a user has formed a connection, association, or relationship via the social networking system 630. For example, in an embodiment, if users in the social networking system 630 are represented as nodes in the social graph, the term "friend" can refer to an edge formed between and directly connecting two user nodes.

Connections may be added explicitly by a user or may be automatically created by the social networking system 630 based on common characteristics of the users (e.g., users who are alumni of the same educational institution). For example, a first user specifically selects a particular other user to be a friend. Connections in the social networking system 630 are usually in both directions, but need not be, so the terms "user" and "friend" depend on the frame of reference. Connections between users of the social networking system 630 are usually bilateral ("two-way"), or "mutual," but connections may also be unilateral, or "one-way." For example, if Bob and Joe are both users of the social networking system 630 and connected to each other, Bob and Joe are each other's connections. If, on the other hand, Bob wishes to connect to Joe to view data communicated to the social networking system 630 by Joe, but Joe does not wish to form a mutual connection, a unilateral connection may be established. The connection between users may be a direct connection; however, some embodiments of the social networking system 630 allow the connection to be indirect via one or more levels of connections or degrees of separation.

In addition to establishing and maintaining connections between users and allowing interactions between users, the social networking system 630 provides users with the ability to take actions on various types of items supported by the social networking system 630. These items may include groups or networks (i.e., social networks of people, entities, and concepts) to which users of the social networking system 630 may belong, events or calendar entries in which a user might be interested, computer-based applications that a user may use via the social networking system 630, transactions that allow users to buy or sell items via services provided by or through the social networking system 630, and interactions with advertisements that a user may perform on or off the social networking system 630. These are just a few examples of the items upon which a user may act on the social networking system 630, and many others are possible. A user may interact with anything that is capable of being represented in the social networking system 630 or in the external system 620, separate from the social networking system 630, or coupled to the social networking system 630 via the network 650.

The social networking system 630 is also capable of linking a variety of entities. For example, the social networking system 630 enables users to interact with each other as well as external systems 620 or other entities through an API, a web service, or other communication channels. The social networking system 630 generates and maintains the "social graph" comprising a plurality of nodes interconnected by a plurality of edges. Each node in the social graph may represent an entity that can act on another node and/or that can be acted on by another node. The social graph may include various types of nodes. Examples of types of nodes include users, non-person entities, content items, web pages, groups, activities, messages, concepts, and any other things that can be represented by an object in the social networking system 630. An edge between two nodes in the social graph may represent a particular kind of connection, or association, between the two nodes, which may result from node relationships or from an action that was performed by one of the nodes on the other node. In some cases, the edges between nodes can be weighted. The weight of an edge can represent an attribute associated with the edge, such as a strength of the connection or association between nodes. Different types of edges can be provided with different weights. For example, an edge created when one user "likes" another user may be given one weight, while an edge created when a user befriends another user may be given a different weight.

As an example, when a first user identifies a second user as a friend, an edge in the social graph is generated connecting a node representing the first user and a second node representing the second user. As various nodes relate or interact with each other, the social networking system 630 modifies edges connecting the various nodes to reflect the relationships and interactions.

The social networking system 630 also includes user-generated content, which enhances a user's interactions with the social networking system 630. User-generated content may include anything a user can add, upload, send, or "post" to the social networking system 630. For example, a user communicates posts to the social networking system 630 from a user device 610. Posts may include data such as status updates or other textual data, location information, images such as photos, videos, links, music or other similar data and/or media. Content may also be added to the social networking system 630 by a third party. Content "items" are represented as objects in the social networking system 630. In this way, users of the social networking system 630 are encouraged to communicate with each other by posting text and content items of various types of media through various communication channels. Such communication increases the interaction of users with each other and increases the frequency with which users interact with the social networking system 630.

The social networking system 630 includes a web server 632, an API request server 634, a user profile store 636, a connection store 638, an action logger 640, an activity log 642, and an authorization server 644. In an embodiment of the invention, the social networking system 630 may include additional, fewer, or different components for various applications. Other components, such as network interfaces, security mechanisms, load balancers, failover servers, management and network operations consoles, and the like are not shown so as to not obscure the details of the system.

The user profile store 636 maintains information about user accounts, including biographic, demographic, and other types of descriptive information, such as work experience, educational history, hobbies or preferences, location, and the like that has been declared by users or inferred by the social networking system 630. This information is stored in the user profile store 636 such that each user is uniquely identified. The social networking system 630 also stores data describing one or more connections between different users in the connection store 638. The connection information may indicate users who have similar or common work experience, group memberships, hobbies, or educational history. Additionally, the social networking system 630 includes user-defined connections between different users, allowing users to specify their relationships with other users. For example, user-defined connections allow users to generate relationships with other users that parallel the users' real-life relationships, such as friends, co-workers, partners, and so forth. Users may select from predefined types of connections, or define their own connection types as needed. Connections with other nodes in the social networking system 630, such as non-person entities, buckets, cluster centers, images, interests, pages, external systems, concepts, and the like are also stored in the connection store 638.

The social networking system 630 maintains data about objects with which a user may interact. To maintain this data, the user profile store 636 and the connection store 638 store instances of the corresponding type of objects maintained by the social networking system 630. Each object type has information fields that are suitable for storing information appropriate to the type of object. For example, the user profile store 636 contains data structures with fields suitable for describing a user's account and information related to a user's account. When a new object of a particular type is created, the social networking system 630 initializes a new data structure of the corresponding type, assigns a unique object identifier to it, and begins to add data to the object as needed. This might occur, for example, when a user becomes a user of the social networking system 630, the social networking system 630 generates a new instance of a user profile in the user profile store 636, assigns a unique identifier to the user account, and begins to populate the fields of the user account with information provided by the user.

The connection store 638 includes data structures suitable for describing a user's connections to other users, connections to external systems 620 or connections to other entities. The connection store 638 may also associate a connection type with a user's connections, which may be used in conjunction with the user's privacy setting to regulate access to information about the user. In an embodiment of the invention, the user profile store 636 and the connection store 638 may be implemented as a federated database.

Data stored in the connection store 638, the user profile store 636, and the activity log 642 enables the social networking system 630 to generate the social graph that uses nodes to identify various objects and edges connecting nodes to identify relationships between different objects. For example, if a first user establishes a connection with a second user in the social networking system 630, user accounts of the first user and the second user from the user profile store 636 may act as nodes in the social graph. The connection between the first user and the second user stored by the connection store 638 is an edge between the nodes associated with the first user and the second user. Continuing this example, the second user may then send the first user a message within the social networking system 630. The action of sending the message, which may be stored, is another edge between the two nodes in the social graph representing the first user and the second user. Additionally, the message itself may be identified and included in the social graph as another node connected to the nodes representing the first user and the second user.

In another example, a first user may tag a second user in an image that is maintained by the social networking system 630 (or, alternatively, in an image maintained by another system outside of the social networking system 630). The image may itself be represented as a node in the social networking system 630. This tagging action may create edges between the first user and the second user as well as create an edge between each of the users and the image, which is also a node in the social graph. In yet another example, if a user confirms attending an event, the user and the event are nodes obtained from the user profile store 636, where the attendance of the event is an edge between the nodes that may be retrieved from the activity log 642. By generating and maintaining the social graph, the social networking system 630 includes data describing many different types of objects and the interactions and connections among those objects, providing a rich source of socially relevant information.

The web server 632 links the social networking system 630 to one or more user devices 610 and/or one or more external systems 620 via the network 650. The web server 632 serves web pages, as well as other web-related content, such as Java, JavaScript, Flash, XML, and so forth. The web server 632 may include a mail server or other messaging functionality for receiving and routing messages between the social networking system 630 and one or more user devices 610. The messages can be instant messages, queued messages (e.g., email), text and SMS messages, or any other suitable messaging format.

The API request server 634 allows one or more external systems 620 and user devices 610 to call access information from the social networking system 630 by calling one or more API functions. The API request server 634 may also allow external systems 620 to send information to the social networking system 630 by calling APIs. The external system 620, in one embodiment, sends an API request to the social networking system 630 via the network 650, and the API request server 634 receives the API request. The API request server 634 processes the request by calling an API associated with the API request to generate an appropriate response, which the API request server 634 communicates to the external system 620 via the network 650. For example, responsive to an API request, the API request server 634 collects data associated with a user, such as the user's connections that have logged into the external system 620, and communicates the collected data to the external system 620. In another embodiment, the user device 610 communicates with the social networking system 630 via APIs in the same manner as external systems 620.

The action logger 640 is capable of receiving communications from the web server 632 about user actions on and/or off the social networking system 630. The action logger 640 populates the activity log 642 with information about user actions, enabling the social networking system 630 to discover various actions taken by its users within the social networking system 630 and outside of the social networking system 630. Any action that a particular user takes with respect to another node on the social networking system 630 may be associated with each user's account, through information maintained in the activity log 642 or in a similar database or other data repository. Examples of actions taken by a user within the social networking system 630 that are identified and stored may include, for example, adding a connection to another user, sending a message to another user, reading a message from another user, viewing content associated with another user, attending an event posted by another user, posting an image, attempting to post an image, or other actions interacting with another user or another object. When a user takes an action within the social networking system 630, the action is recorded in the activity log 642. In one embodiment, the social networking system 630 maintains the activity log 642 as a database of entries. When an action is taken within the social networking system 630, an entry for the action is added to the activity log 642. The activity log 642 may be referred to as an action log.

Additionally, user actions may be associated with concepts and actions that occur within an entity outside of the social networking system 630, such as an external system 620 that is separate from the social networking system 630. For example, the action logger 640 may receive data describing a user's interaction with an external system 620 from the web server 632. In this example, the external system 620 reports a user's interaction according to structured actions and objects in the social graph.

Other examples of actions where a user interacts with an external system 620 include a user expressing an interest in an external system 620 or another entity, a user posting a comment to the social networking system 630 that discusses an external system 620 or a web page 622a within the external system 620, a user posting to the social networking system 630 a Uniform Resource Locator (URL) or other identifier associated with an external system 620, a user attending an event associated with an external system 620, or any other action by a user that is related to an external system 620. Thus, the activity log 642 may include actions describing interactions between a user of the social networking system 630 and an external system 620 that is separate from the social networking system 630.

The authorization server 644 enforces one or more privacy settings of the users of the social networking system 630. A privacy setting of a user determines how particular information associated with a user can be shared. The privacy setting comprises the specification of particular information associated with a user and the specification of the entity or entities with whom the information can be shared. Examples of entities with which information can be shared may include other users, applications, external systems 620, or any entity that can potentially access the information. The information that can be shared by a user comprises user account information, such as profile photos, phone numbers associated with the user, user's connections, actions taken by the user such as adding a connection, changing user profile information, and the like.

The privacy setting specification may be provided at different levels of granularity. For example, the privacy setting may identify specific information to be shared with other users; the privacy setting identifies a work phone number or a specific set of related information, such as, personal information including profile photo, home phone number, and status. Alternatively, the privacy setting may apply to all the information associated with the user. The specification of the set of entities that can access particular information can also be specified at various levels of granularity. Various sets of entities with which information can be shared may include, for example, all friends of the user, all friends of friends, all applications, or all external systems 620. One embodiment allows the specification of the set of entities to comprise an enumeration of entities. For example, the user may provide a list of external systems 620 that are allowed to access certain information. Another embodiment allows the specification to comprise a set of entities along with exceptions that are not allowed to access the information. For example, a user may allow all external systems 620 to access the user's work information, but specify a list of external systems 620 that are not allowed to access the work information. Certain embodiments call the list of exceptions that are not allowed to access certain information a "block list". External systems 620 belonging to a block list specified by a user are blocked from accessing the information specified in the privacy setting. Various combinations of granularity of specification of information, and granularity of specification of entities, with which information is shared are possible. For example, all personal information may be shared with friends whereas all work information may be shared with friends of friends.

The authorization server 644 contains logic to determine if certain information associated with a user can be accessed by a user's friends, external systems 620, and/or other applications and entities. The external system 620 may need authorization from the authorization server 644 to access the user's more private and sensitive information, such as the user's work phone number. Based on the user's privacy settings, the authorization server 644 determines if another user, the external system 620, an application, or another entity is allowed to access information associated with the user, including information about actions taken by the user.

In some embodiments, the social networking system 630 can include an object content item module 646. The object content item module 646 can be implemented with the object content item module 102, as discussed in more detail herein. In some embodiments, one or more functionalities of the object content item module 646 can be implemented in the user device 610.

Hardware Implementation

Figure 7:
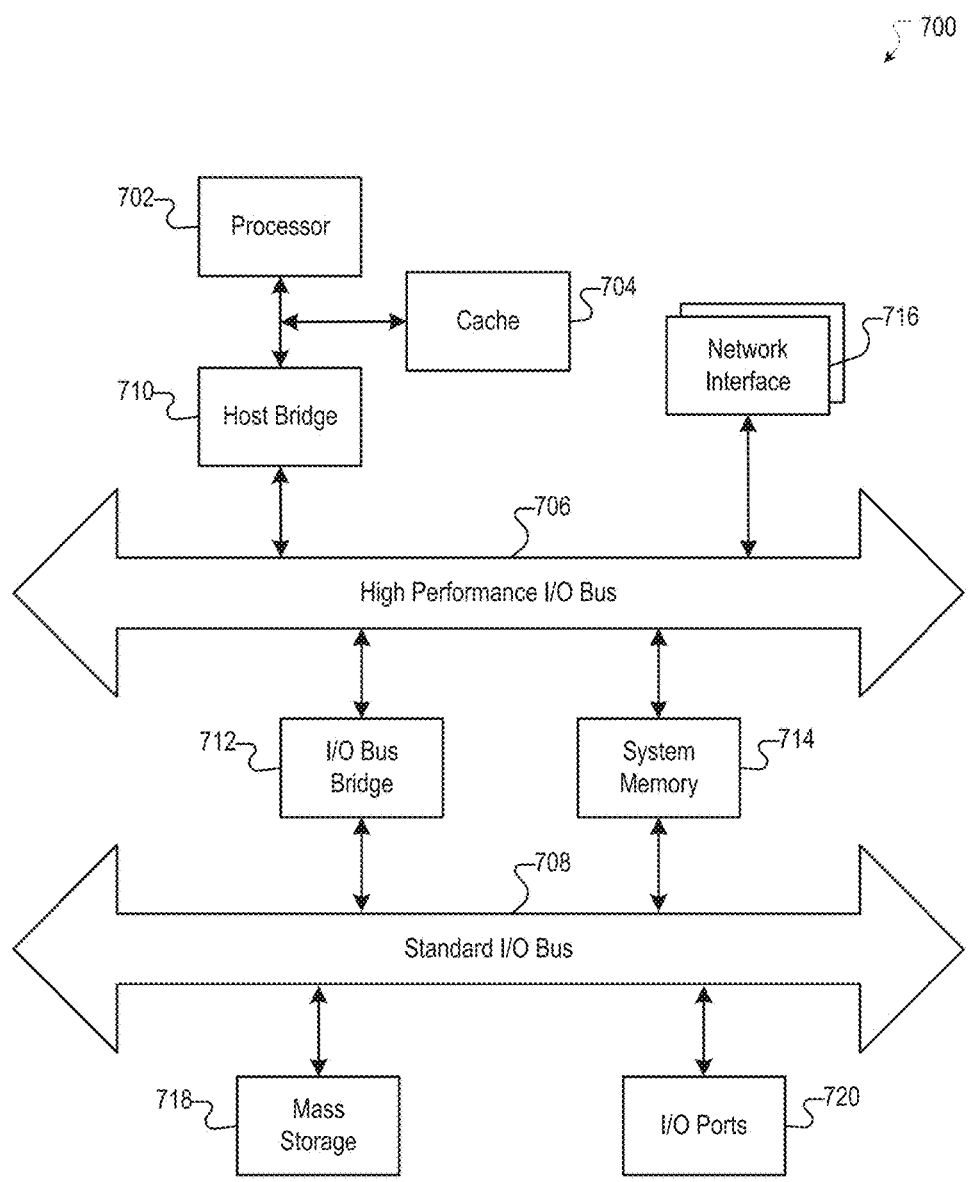
FIG. 7 illustrates an example of a computer system that can be utilized in various scenarios, according to an embodiment of the present disclosure.

The foregoing processes and features can be implemented by a wide variety of machine and computer system architectures and in a wide variety of network and computing environments. FIG. 7 illustrates an example of a computer system 700 that may be used to implement one or more of the embodiments described herein in accordance with an embodiment of the invention. The computer system 700 includes sets of instructions for causing the computer system 700 to perform the processes and features discussed herein. The computer system 700 may be connected (e.g., networked) to other machines. In a networked deployment, the computer system 700 may operate in the capacity of a server machine or a client machine in a client-server network environment, or as a peer machine in a peer-to-peer (or distributed) network environment. In an embodiment of the invention, the computer system 700 may be the social networking system 630, the user device 610, and the external system 720, or a component thereof. In an embodiment of the invention, the computer system 700 may be one server among many that constitutes all or part of the social networking system 630.

The computer system 700 includes a processor 702, a cache 704, and one or more executable modules and drivers, stored on a computer-readable medium, directed to the processes and features described herein. Additionally, the computer system 700 includes a high performance input/output (I/O) bus 706 and a standard I/O bus 708. A host bridge 710 couples processor 702 to high performance I/O bus 706, whereas I/O bus bridge 712 couples the two buses 706 and 708 to each other. A system memory 714 and one or more network interfaces 716 couple to high performance I/O bus 706. The computer system 700 may further include video memory and a display device coupled to the video memory (not shown). Mass storage 718 and I/O ports 720 couple to the standard I/O bus 708. The computer system 700 may optionally include a keyboard and pointing device, a display device, or other input/output devices (not shown) coupled to the standard I/O bus 708. Collectively, these elements are intended to represent a broad category of computer hardware systems, including but not limited to computer systems based on the x86-compatible processors manufactured by Intel Corporation of Santa Clara, Calif., and the x86-compatible processors manufactured by Advanced Micro Devices (AMD), Inc., of Sunnyvale, Calif., as well as any other suitable processor.

An operating system manages and controls the operation of the computer system 700, including the input and output of data to and from software applications (not shown). The operating system provides an interface between the software applications being executed on the system and the hardware components of the system. Any suitable operating system may be used, such as the LINUX Operating System, the Apple Macintosh Operating System, available from Apple Computer Inc. of Cupertino, Calif., UNIX operating systems, Microsoft® Windows® operating systems, BSD operating systems, and the like. Other implementations are possible.

The elements of the computer system 700 are described in greater detail below. In particular, the network interface 716 provides communication between the computer system 700 and any of a wide range of networks, such as an Ethernet (e.g., IEEE 802.3) network, a backplane, etc. The mass storage 718 provides permanent storage for the data and programming instructions to perform the above-described processes and features implemented by the respective computing systems identified above, whereas the system memory 714 (e.g., DRAM) provides temporary storage for the data and programming instructions when executed by the processor 702. The I/O ports 720 may be one or more serial and/or parallel communication ports that provide communication between additional peripheral devices, which may be coupled to the computer system 700.

The computer system 700 may include a variety of system architectures, and various components of the computer system 700 may be rearranged. For example, the cache 704 may be on-chip with processor 702. Alternatively, the cache 704 and the processor 702 may be packed together as a "processor module", with processor 702 being referred to as the "processor core". Furthermore, certain embodiments of the invention may neither require nor include all of the above components. For example, peripheral devices coupled to the standard I/O bus 708 may couple to the high performance I/O bus 706. In addition, in some embodiments, only a single bus may exist, with the components of the computer system 700 being coupled to the single bus. Moreover, the computer system 700 may include additional components, such as additional processors, storage devices, or memories.

In general, the processes and features described herein may be implemented as part of an operating system or a specific application, component, program, object, module, or series of instructions referred to as "programs". For example, one or more programs may be used to execute specific processes described herein. The programs typically comprise one or more instructions in various memory and storage devices in the computer system 700 that, when read and executed by one or more processors, cause the computer system 700 to perform operations to execute the processes and features described herein. The processes and features described herein may be implemented in software, firmware, hardware (e.g., an application specific integrated circuit), or any combination thereof.

In one implementation, the processes and features described herein are implemented as a series of executable modules run by the computer system 700, individually or collectively in a distributed computing environment. The foregoing modules may be realized by hardware, executable modules stored on a computer-readable medium (or machine-readable medium), or a combination of both. For example, the modules may comprise a plurality or series of instructions to be executed by a processor in a hardware system, such as the processor 702. Initially, the series of instructions may be stored on a storage device, such as the mass storage 718. However, the series of instructions can be stored on any suitable computer readable storage medium. Furthermore, the series of instructions need not be stored locally, and could be received from a remote storage device, such as a server on a network, via the network interface 716. The instructions are copied from the storage device, such as the mass storage 718, into the system memory 714 and then accessed and executed by the processor 702. In various implementations, a module or modules can be executed by a processor or multiple processors in one or multiple locations, such as multiple servers in a parallel processing environment.

Examples of computer-readable media include, but are not limited to, recordable type media such as volatile and non-volatile memory devices; solid state memories; floppy and other removable disks; hard disk drives; magnetic media; optical disks (e.g., Compact Disk Read-Only Memory (CD ROMS), Digital Versatile Disks (DVDs)); other similar non-transitory (or transitory), tangible (or non-tangible) storage medium; or any type of medium suitable for storing, encoding, or carrying a series of instructions for execution by the computer system 700 to perform any one or more of the processes and features described herein.

For purposes of explanation, numerous specific details are set forth in order to provide a thorough understanding of the description. It will be apparent, however, to one skilled in the art that embodiments of the disclosure can be practiced without these specific details. In some instances, modules, structures, processes, features, and devices are shown in block diagram form in order to avoid obscuring the description. In other instances, functional block diagrams and flow diagrams are shown to represent data and logic flows. The components of block diagrams and flow diagrams (e.g., modules, blocks, structures, devices, features, etc.) may be variously combined, separated, removed, reordered, and replaced in a manner other than as expressly described and depicted herein.

Reference in this specification to "one embodiment", "an embodiment", "other embodiments", "one series of embodiments", "some embodiments", "various embodiments", or the like means that a particular feature, design, structure, or characteristic described in connection with the embodiment is included in at least one embodiment of the disclosure. The appearances of, for example, the phrase "in one embodiment" or "in an embodiment" in various places in the specification are not necessarily all referring to the same embodiment, nor are separate or alternative embodiments mutually exclusive of other embodiments. Moreover, whether or not there is express reference to an "embodiment" or the like, various features are described, which may be variously combined and included in some embodiments, but also variously omitted in other embodiments. Similarly, various features are described that may be preferences or requirements for some embodiments, but not other embodiments.

The language used herein has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A computer-implemented method comprising:
   identifying, by a computing system, a first object included in a video content item;
   determining, by the computing system, a first content item associated with the first object during playback of the video content item;
   providing, by the computing system, a first indicator associated with the first content item in the video content item;
   providing, by the computing system, the first content item in response to a selection of the first indicator, wherein the selection of the first indicator creates a layer for presenting the first content item, the first content item is provided in the layer, and playback of the video content item can pause and resume while the layer is presented; and
   providing, by the computing system, a second content item in the layer, in response to a selection of a second indicator, wherein the second content item is associated with a second object identified during playback of the video content item while the layer is presented.

2. The computer-implemented method of claim 1, wherein the layer is a layer for presenting three-dimensional content.

3. The computer-implemented method of claim 2, wherein the layer is an augmented reality (AR) layer.

4. The computer-implemented method of claim 2, wherein the first content item or the second content item is a three-dimensional model of the first object or the second object.

5. The computer-implemented method of claim 2, wherein the layer is presented on top of the video content item.

6. The computer-implemented method of claim 5, wherein the layer is removed in response to one or more of: completion of playback of the first content item or the second content item or a selection by a user.

7. The computer-implemented method of claim 1, wherein the first object or the second object includes one or more of: a logo or a brand.

8. The computer-implemented method of claim 1, wherein the first object or the second object is detected based on one or more of: object detection or object tracking.

9. The computer-implemented method of claim 1, wherein the first object or the second object is defined in the video content item based on user input.

10. The computer-implemented method of claim 1, wherein the first content item or the second content item includes one or more of: an advertisement or a menu for purchasing an item associated with the first object or the second object.

11. A system comprising:
    at least one hardware processor; and
    a memory storing instructions that, when executed by the at least one processor, cause the system to perform:
    identifying a first object included in a video content item;
    determining a first content item associated with the first object during playback of the video content item;
    providing a first indicator associated with the first content item in the video content item;
    providing the first content item in response to a selection of the first indicator, wherein the selection of the first indicator creates a layer for presenting the first content item, the first content item is provided in the layer, and playback of the video content item can pause and resume while the layer is presented; and
    providing a second content item in the layer, in response to a selection of a second indicator, wherein the second content item is associated with a second object identified during playback of the video content item while the layer is presented.

12. The system of claim 11, wherein the layer is a layer for presenting three-dimensional content.

13. The system of claim 12, wherein the layer is an augmented reality (AR) layer.

14. The system of claim 12, wherein the first content item or the second content item is a three-dimensional model of the first object or the second object.

15. The system of claim 12, wherein the layer is presented on top of the video content item.

16. A non-transitory computer readable medium including instructions that, when executed by at least one hardware processor of a computing system, cause the computing system to perform a method comprising:

identifying a first object included in a video content item;

determining a first content item associated with the first object during playback of the video content item;

providing a first indicator associated with the first content item in the video content item;

providing the first content item in response to a selection of the first indicator, wherein the selection of the first indicator creates a layer for presenting the first content item, the first content item is provided in the layer, and wherein of the video content item can pause and resume while the layer is presented; and providing a second content item in the layer, in response to a selection of a second indicator, wherein the second content item is associated with a second object identified during playback of the video content item while the layer is presented.

17. The non-transitory computer readable medium of claim 16, wherein the layer is a layer for presenting three-dimensional content.

18. The non-transitory computer readable medium of claim 17, wherein the layer is an augmented reality (AR) layer.

19. The non-transitory computer readable medium of claim 17, wherein the first content item or the second content item is a three-dimensional model of the first object or the second object.

20. The non-transitory computer readable medium of claim 17, wherein the layer is presented on top of the video content item.

\* \* \* \* \*